United States Patent
Tu (10) Patent No.: US 9,847,480 B2
(45) Date of Patent: Dec. 19, 2017

(54) RESISTANCE VARIABLE MEMORY STRUCTURE AND METHOD OF FORMING THE SAME

(71) Applicant: TAIWAN SEMICONDUCTOR MANUFACTURING COMPANY, LTD., Hsinchu (TW)

(72) Inventor: Kuo-Chi Tu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/630,001

(22) Filed: Sep. 28, 2012

(65) Prior Publication Data

US 2014/0091271 A1 Apr. 3, 2014

(51) Int. Cl.
*H01L 45/00* (2006.01)

(52) U.S. Cl.
CPC .......... *H01L 45/08* (2013.01); *H01L 45/1233* (2013.01); *H01L 45/146* (2013.01); *H01L 45/1675* (2013.01)

(58) Field of Classification Search
CPC ....... H01L 45/04; H01L 45/16; H01L 45/122; H01L 45/1233; H01L 45/1253; H01L 45/1608; H01L 45/08; H01L 45/45; H01L 45/085; H01L 45/145; H01L 45/146; H01L 45/1675
See application file for complete search history.

(56) References Cited

U.S. PATENT DOCUMENTS

| | | | |
|---|---|---|---|
| 6,849,891 B1 | 2/2005 | Hsu et al. | |
| 7,169,637 B2 | 1/2007 | Zhang et al. | |
| 7,407,858 B2 | 8/2008 | Li et al. | |
| 7,795,606 B2 | 9/2010 | Jin et al. | |
| 8,000,128 B2 | 8/2011 | Li et al. | |
| 8,009,454 B2 | 8/2011 | Lee et al. | |
| 8,377,718 B2 * | 2/2013 | Srinivasan | H01L 21/02104 257/E21.459 |
| 8,435,830 B2 * | 5/2013 | Jeong et al. | 438/102 |
| 8,598,560 B1 * | 12/2013 | Milojevic | H01L 45/085 257/1 |

(Continued)

FOREIGN PATENT DOCUMENTS

| | | |
|---|---|---|
| CN | 102655210 | 9/2012 |
| KR | 20130091620 | 8/2013 |

OTHER PUBLICATIONS

Chen, Y. S. et al., "Challenges and Opportunities for HfOx Based Resistive Random Access Memory", IEEE, 2011, pp. IEDM11-717-IEMD11-720.

(Continued)

*Primary Examiner* — Cheung Lee
*Assistant Examiner* — Stephen C Smith
(74) *Attorney, Agent, or Firm* — Slater Matsil, LLP (57) ABSTRACT

A semiconductor structure includes a resistance variable memory structure. The semiconductor structure also includes a dielectric layer. A portion of the resistance variable memory structure is over the dielectric layer. The resistance variable memory structure includes a first electrode embedded in the dielectric layer. A resistance variable layer disposed over the first electrode and a portion of the dielectric layer. A second electrode disposed over the resistance variable layer.

20 Claims, 4 Drawing Sheets

(56) References Cited

U.S. PATENT DOCUMENTS

| | | | |
|---|---|---|---|
| 2006/0126423 A1 | 6/2006 | Aratani et al. | |
| 2006/0284214 A1* | 12/2006 | Chen | H01L 27/2436 257/213 |
| 2009/0008705 A1 | 1/2009 | Zhu et al. | |
| 2009/0309088 A1* | 12/2009 | Sakamoto | H01L 27/24 257/2 |
| 2010/0110758 A1 | 5/2010 | Li et al. | |
| 2010/0144121 A1 | 6/2010 | Chang et al. | |
| 2010/0240189 A1* | 9/2010 | Jeong | H01L 21/7684 438/385 |
| 2011/0204314 A1* | 8/2011 | Baek et al. | 257/4 |
| 2011/0220862 A1 | 9/2011 | Arita et al. | |
| 2011/0233679 A1 | 9/2011 | Chen et al. | |
| 2011/0291064 A1 | 12/2011 | Marsh et al. | |
| 2012/0008366 A1* | 1/2012 | Lu | G11C 13/0002 365/148 |
| 2012/0012897 A1* | 1/2012 | Besser | H01L 27/101 257/208 |
| 2012/0211719 A1* | 8/2012 | Haimoto et al. | 257/4 |
| 2012/0223284 A1* | 9/2012 | Tamai | H01L 45/08 257/4 |
| 2013/0200455 A1 | 8/2013 | Lo et al. | |

OTHER PUBLICATIONS

Wong, H. S. Philip, et al., "Metal-Oxide RRAM", Proceedings of the IEEE, vol. 100, No. 6, Jun. 2012, pp. 1951-1970.

* cited by examiner

RESISTANCE VARIABLE MEMORY STRUCTURE AND METHOD OF FORMING THE SAME

TECHNICAL FIELD

This disclosure relates generally to a semiconductor structure and, more particularly, to a resistance variable memory structure and method for forming a resistance variable memory structure.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, each RRAM cell includes a resistance variable layer, the resistance of which can be adjusted to represent logic "0" or logic "1".

From an application point of view, RRAM has many advantages. RRAM has a simple cell structure and CMOS logic comparable processes which result in a reduction of the manufacturing complexity and cost in comparison with other non-volatile memory structures. Despite the attractive properties noted above, a number of challenges exist in connection with developing RRAM. Various techniques directed at configurations and materials of these RRAMs have been implemented to try and further improve device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, a semiconductor structure includes a resistance variable memory structure. The resistance variable memory structure includes a resistance variable layer formed between two electrodes. By applying a specific voltage to each of the two electrodes, an electric resistance of the resistance variable layer is altered. The low and high resistances are utilized to indicate a digital signal "1" or "0", thereby allowing for data storage. The switching behavior does not depend only on the materials of the resistance variable layer but also depends on the choice of electrodes and interfacial properties of the electrodes.

According to one or more embodiments of this disclosure, the semiconductor structure having a resistance variable memory structure is formed within a chip region of a substrate. A plurality of semiconductor chip regions is marked on the substrate by scribe lines between the chip regions. The substrate will go through a variety of cleaning, layering, patterning, etching and doping steps to form the semiconductor structures. The term "substrate" herein generally refers to a bulk substrate on which various layers and device structures are formed. In some embodiments, the bulk substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits.

Figure 1:
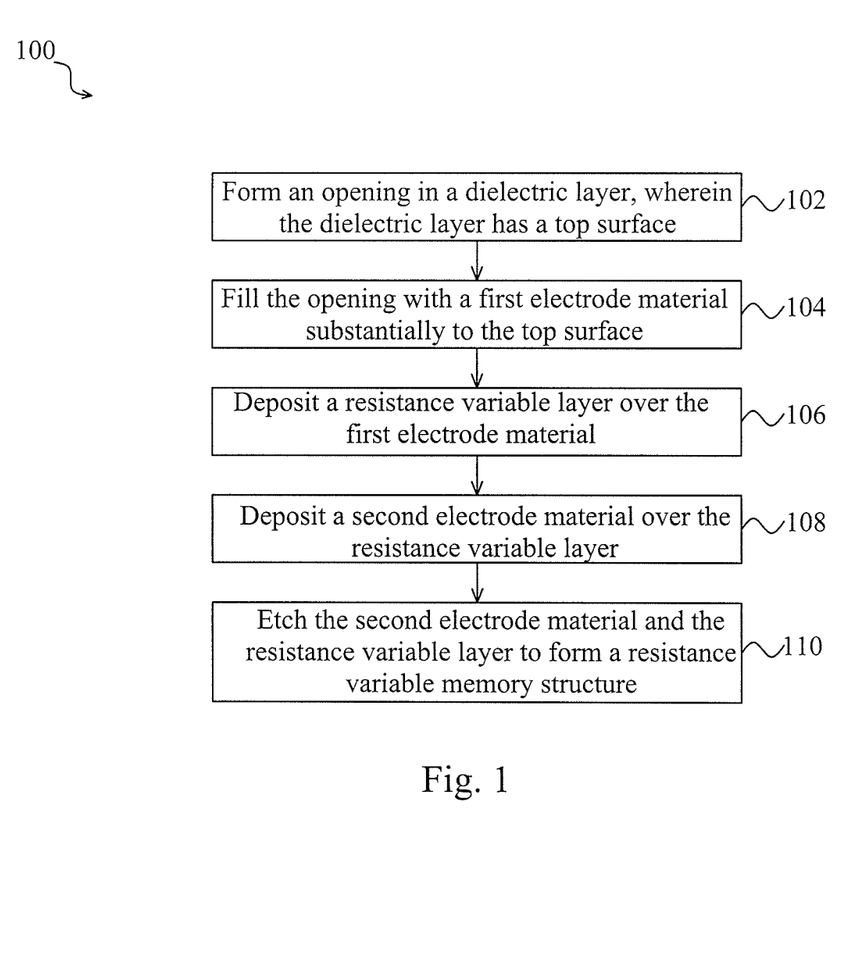
FIG. 1 is a flowchart of a method of forming a semiconductor structure having a resistance variable memory structure according to one or more embodiments of this disclosure.

FIG. 1 is a flowchart of a method 100 of forming a semiconductor structure having a resistance variable memory structure according to one or more embodiments of this disclosure. FIGS. 2A to 2I are cross-sectional views of semiconductor structures 200A and 200B each having a resistance variable memory structure at various stages of manufacture according to various embodiments of the method 100 of FIG. 1. It should be noted that additional processes may be provided before, during, or after the method 100 of FIG. 1. Various figures have been simplified for a better understanding of the inventive concepts of the present disclosure.

Referring now to FIG. 1, the flowchart of the method 100 begins with operation 102. An opening is formed in a dielectric layer. The dielectric layer has a top surface. The dielectric layer is formed on a substrate having at least one conductive structure on a top portion of the substrate. In at least one embodiment, the opening is etched from the top surface of the dielectric layer to expose a portion of the at least one conductive structure.

Figure 2A:
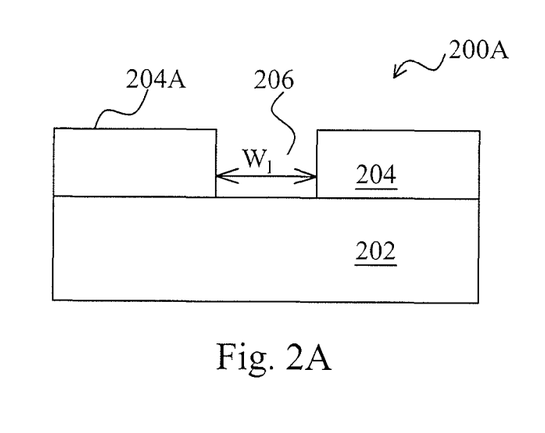
FIGS. 2A to 2I are cross-sectional views of semiconductor structures having a resistance variable memory structure at various stages of manufacture according to one or more embodiments of the method of FIG. 1.

Referring to FIG. 2A, which is an enlarged cross-sectional view of a portion of a semiconductor structure 200A having a resistance variable memory structure after performing operation 102. The semiconductor structure 200A includes a substrate (not shown) such as a silicon carbide (SiC) substrate, GaAs, InP, Si/Ge or a silicon substrate. The substrate may include a plurality of layers formed on a top portion of the substrate. Examples of such layers include dielectric layers, doped layers, polysilicon layers or conductive layers. The substrate may further include a plurality of device structures formed within the plurality of layers. Examples of device structures include transistors, resistors, and/or capacitors.

In the illustrated examples of FIGS. 2A-2I, the semiconductor structures 200A and 200B include a conductive structure 202 formed on the top portion of the substrate (not shown). The conductive structure 202 may include a conductive interconnect, a doped region or a silicide region. In some embodiments, the conductive structure 202 may include Al, Cu, Ti, Ta, W, Mo, TaN, NiSi, CoSi, TiN, WN or silicon. The conductive structure 202 is formed by a suitable process, including deposition, lithography patterning, doping, implanting, or etching processes.

A dielectric layer 204 is deposited over the conductive structure 202. The dielectric layer 204 has a top surface 204A. The dielectric layer 204 comprises silicon oxide, fluorinated silica glass (FSG), carbon doped silicon oxide, silicon nitride, silicon oxynitride, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof. The deposition process may include chemical vapor deposition (CVD), atomic layer deposition (ALD), high density plasma CVD (HDPCVD) or spinning on glass.

An opening 206 is etched in the dielectric layer 204 extending from the top surface 204A to a top surface of the conductive structure 202 to expose a portion of the conductive structure 202. The opening 206 has sidewalls and a width $W_1$. The opening 206 is formed by suitable process, including lithography patterning, and etching processes.

Figure 2B:
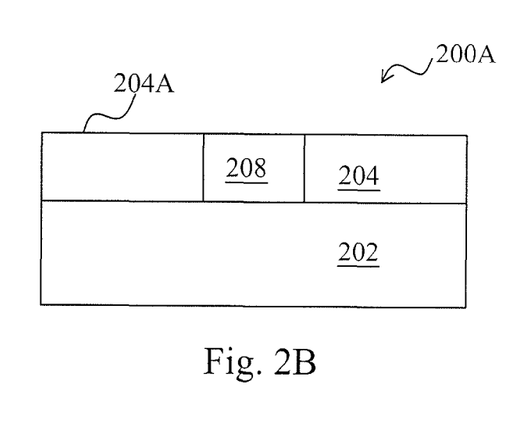

FIG. 2B is a cross-sectional view of the semiconductor structure 200A after a barrier layer 208 is optionally formed in the opening 206. The barrier layer 208 comprises at least one of TiN, Ti, Ta, TaN, W or WN. In at least one embodiment, a barrier material may overfill the opening 206 in the dielectric layer 204. Possible formation methods include electroless plating, sputtering, electro plating, physical vapor deposition (PVD) or CVD. The excess barrier material outside the opening 206 is removed through a suitable process such as chemical mechanical polishing (CMP) or planarization etching back process.

Figure 2C:
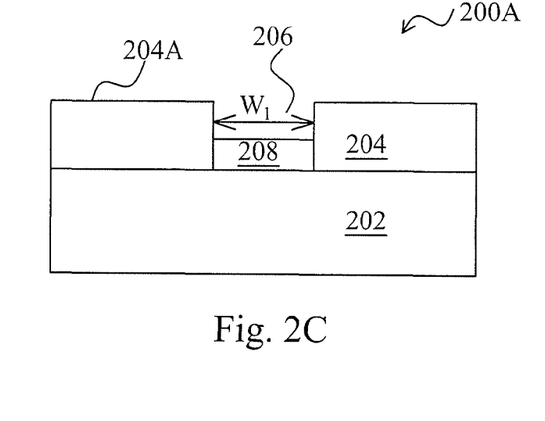

FIG. 2C is a cross-sectional view of the semiconductor structure 200A after a top portion of the barrier layer 208 is removed from the opening 206. An etching process is performed to remove the top portion of the barrier layer 208 and leave a remained portion of the barrier layer 208 filled in a bottom section of the opening 206. The etching process may include a dry etching process, wet etching process, or a combination thereof.

Referring back to FIG. 1, the method 100 continues with operation 104 in which the opening is filled with a first electrode material substantially to the top surface of the dielectric layer.

Figure 2D:
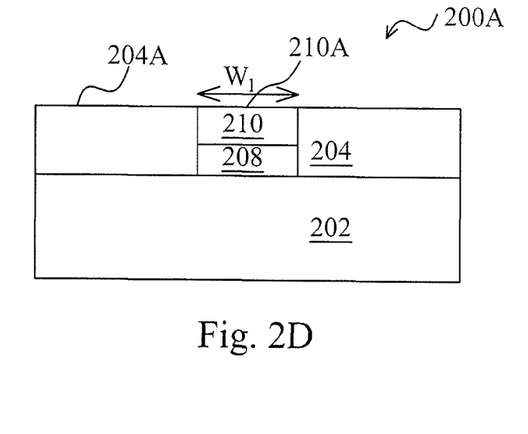

FIG. 2D is a cross-sectional view of the semiconductor structure 200A after performing operation 104. A first electrode 210 is filled in the opening 206 overlying the barrier layer 208. The first electrode 210 includes a first electrode conductive material having a proper work function such that a high work function wall is built between the first electrode 210 and a resistance variable layer subsequently formed. The first electrode 210 may comprise Pt, AlCu, TiN, Au, Ti, Ta, TaN, TaN, W, WN or Cu. In at least one embodiment, a first electrode conductive material may overfill the opening 206 of the dielectric layer 204 in FIG. 2C. Possible formation methods include electroless plating, sputtering, electro plating, PVD or ALD. Then, the excess first electrode conductive material outside the opening 206 is removed through a suitable planarization process such as CMP or planarization etching back process. The first electrode 210 is formed in a top section of the opening 206, and embedded in the dielectric layer 204. The first electrode 210 has a top surface 210A substantially coplanar to the top surface 204A of the dielectric layer 204. Since the barrier layer 208 and the first electrode 210 are formed in the same opening 206, the barrier layer 208 and the first electrode 210 have a substantially same width $W_1$ as the opening 206 and aligned sidewalls. The conductive structure 202 is electrically connected to the first electrode 210 through the barrier layer 208.

The barrier layer 208 deposited on the conductive structure 202 and under the first electrode 210 is designed to prevent inter-mixing of the materials in the conductive structure 202 and the first electrode 210. The barrier layer 208 prevents diffusion between the conductive structure 202 and the first electrode 210 and any junction spiking. The electrical performances the semiconductor structure 200A is thus improved.

Referring back to FIG. 1, method 100 continues with operations 106 and 108. In operation 106, a resistance variable layer is deposited over the first electrode material. In operation 108, a second electrode material is deposited over the resistance variable layer.

Figure 2E:
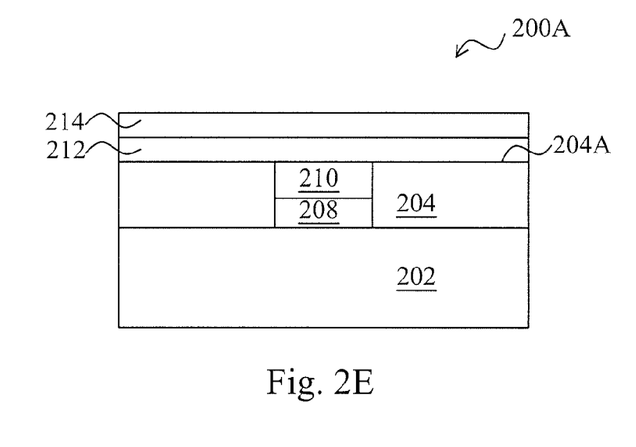

FIG. 2E is a cross-sectional view of the semiconductor structure 200A after performing operations 106 and 108. A resistance variable layer 212 is deposited over the first electrode 210 and the dielectric layer 204. The resistance variable layer 212 has a resistivity capable of switching between a high resistance state and a low resistance state (or conductive), by application of an electrical voltage. In various embodiments, the resistance variable layer 212 includes dielectric materials comprising a high-k dielectric material, a binary metal oxide or a transition metal oxide. In some embodiments, the resistance variable layer 212 includes nickel oxide, titanium oxide, hafnium oxide, zirconium oxide, zinc oxide, tungsten oxide, aluminum oxide, tantalum oxide, molybdenum oxide or copper oxide. Possible formation methods include PVD or ALD, such as ALD with a precursor containing zirconium and oxygen. In one example, the resistance variable layer 212 has a thickness in a range from about 20 angstrom to about 200 angstrom.

A second electrode material 214 is deposited over the resistance variable layer 212. The second electrode material 214 may include suitable conductive material to electrically connect a subsequently formed resistance variable memory structure to other portions of an interconnect structure for electrical routing. The second electrode material 214 may comprise Pt, AlCu, TiN, Au, Ti, Ta, TaN, TaN, W, WN or Cu. In some embodiments, the first electrode material 210 and the second electrode material 214 have a same composition. In some embodiments, the first electrode material 210 and the second electrode material 214 have different compositions. Possible formation methods include electroless plating, sputtering, electro plating, PVD or ALD.

Figure 2F:
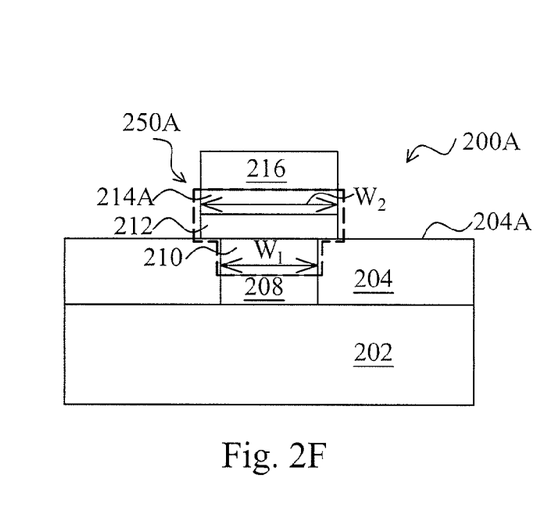
Figure 2G:
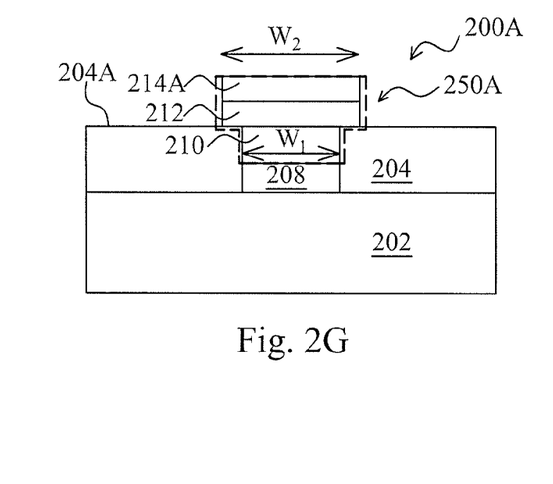
Figure 2H:
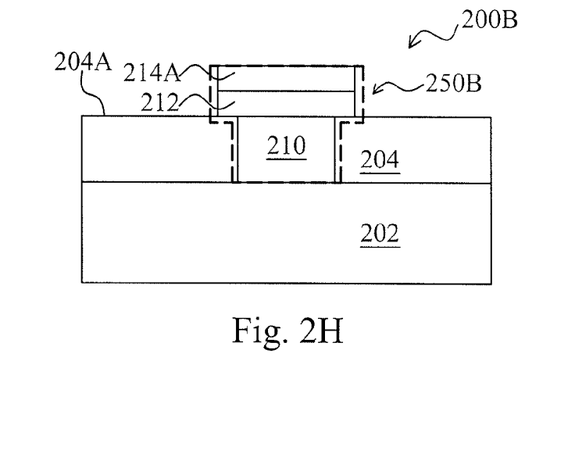
Figure 2I:
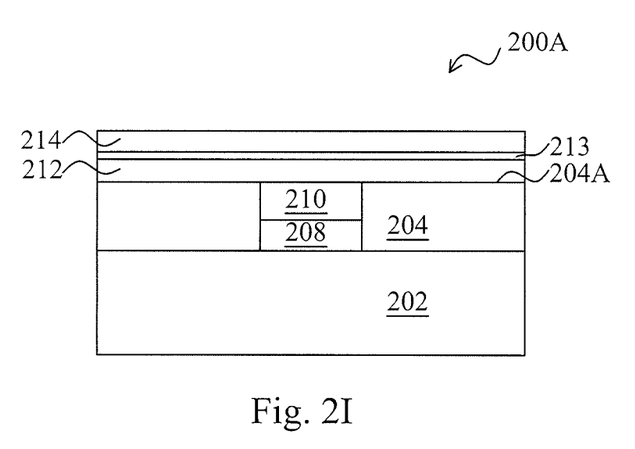

In some examples, the semiconductor structure 200A may further includes a cap layer 213 optionally formed on the resistance variable layer 212 and underlying the second electrode material 214 as shown in FIG. 2I. The cap layer includes a conductive material that is unstable, capable of depriving oxygen from the resistance variable layer 212, and creates vacancy defects in the resistance variable layer 212. The cap layer comprises titanium, tantalum or hafnium.

Referring back to FIG. 1, the method 100 continues with operation 110 in which the second electrode material and the resistance variable layer are etched to form a resistance variable memory structure.

FIGS. 2F and 2G are cross-sectional views of the semiconductor structure 200A after performing operation 110. In FIG. 2F, a mask layer 216 having a feature with a width $W_2$ is formed over the second electrode material 214. The feature is formed by suitable process, including deposition, lithography patterning, and/or etching processes. In at least one embodiment, the feature of the mask layer 216 overlies the first electrode 210 and covers a region having the width $W_2$ wider than the width $W_1$ of the first electrode 210. An etching process is performed to remove the second electrode material 214 and the resistance variable layer 212 not underlying the mask layer 216. Then, a second electrode 214A is defined and a resistance variable memory structure 250A is formed. Since the second electrode material 214 and the resistance variable layer 212 are covered and etched under the same mask layer 216, the second electrode 214A and the patterned resistance variable layer 212 have a substantially same width $W_2$ wider than the width $W_1$ of the first electrode 210. Also, the second electrode 214A and the patterned resistance variable layer 212 have substantially aligned sidewalls.

In certain embodiments, the feature of the mask layer 216 overlies the first electrode 210 and covers a region having the width $W_2$ less than the width $W_1$ of the first electrode 210. The second electrode 214A and the patterned resistance variable layer 212 have a substantially same width $W_2$ less than the width $W_1$ of the first electrode 210.

FIG. 2G illustrates a cross-sectional view of the semiconductor structure 200A after the mask layer 216 is removed and a top surface of the second electrode 214A of the resistance variable memory structure 250A is exposed. The removing process may include a dry etching process, wet etching process, or combination thereof.

FIG. 2H is a cross-sectional view of the semiconductor structure 200B having another resistance variable memory structure 250B according to various embodiments of the method 100 of FIG. 1. The layer stacks and manufacture methods of the semiconductor structure 200B are similar to the semiconductor structure 200A. However, the resistance variable memory structure 250B in the semiconductor structure 200B does not include the barrier layer 208 of the semiconductor structure 200A. The conductive structure 202 is electrically connected directly to the first electrode 210.

Figure 3:
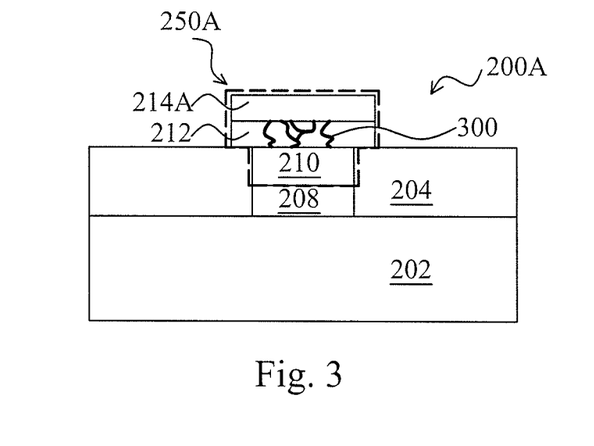
FIG. 3 illustrates a cross-sectional view of a resistance variable memory structure in operation with filaments formed in a resistance variable layer of the resistance variable memory structure according to one or more embodiments of this disclosure.

FIG. 3 is an enlarged cross-sectional view of the semiconductor structure 200A having a resistance variable memory structure 250A in various operations for data storage. In a "forming" operation, a "forming" voltage is applied to the first and second electrodes 210 and 214A of the resistance variable memory structure. The "forming" voltage is high enough to generate a conductive portion in the resistance variable layer 212. In one example, the conductive portion includes one or more conductive filaments 300 to provide a conductive path such that the resistance variable layer 212 shows an "on" or low resistance state. The conductive path may be related to the lineup of the defect (e.g. oxygen) vacancies in the resistance variable layer 212. In some embodiments, the "forming" voltage is applied only one time. Once the conductive path is formed, the conductive path will remain present in the resistance variable layer 212. Other operations may disconnect or reconnect the conductive path using smaller voltages or different voltages.

In a "set" operation, a "set" voltage high enough to reconnect the conductive path in the resistance variable layer 212 is applied to the resistance variable memory structure 250A such that the resistance variable layer 212 shows the "on" or low resistance state. The "set" operation turns the resistance variable layer 212 to the low resistance state.

In a "reset" operation, a "reset" voltage high enough to break the conductive path in the resistance variable layer 212 is applied to the resistance variable memory structure 250A such that the resistance variable layer 212 shows an "off" or high resistance state. By applying a specific voltage between two electrodes 210 and 214A, an electric resistance of the resistance variable layer 212 is altered after applying the specific voltage. The low and high resistances are utilized to indicate a digital signal "1" or "0", thereby allowing for data storage.

Various embodiments of the present disclosure may be used to improve the performance of a resistance variable memory structure. For example, the first electrode 210 is formed by a filling process in the opening 206 in operation 104. The second electrode 214A is formed by an etching process in operation 110. The disclosed method includes a single etching process (in operation 110) used to form both electrodes 210 and 214A. This disclosure eliminates drawbacks in conventional methods such as etching damage to the resistance variable layer 212 due to multiple etching steps in patterning both the first and second electrodes 210 and 214A which leads to long exposure times in plasma environments. Without etching damages in the resistance variable layer 212, a possible leakage current in the resistance variable memory structures 250A and 250B is reduced.

In another example, an operation current of the resistance variable memory structure (250A or 250B) is related to an area of the conductive paths (or conductive filaments 300) in the resistance variable layer 212. The area of the conductive paths (or conductive filaments 300) is confined within the width $W_1$ of the first electrode 210 and the width $W_2$ of the second electrode 214A after the "forming" operation. The smaller of either the width $W_1$ or the width $W_2$ dictates a width of the area of the conductive paths in the resistance variable layer 212. As lithography patterning processes continue shrinking the width $W_1$ and the width $W_2$, the operation current of the resistance variable memory structure (250A or 250B) also is capable of being further reduced. In this disclosure, the width $W_1$ is decided by the lithography patterning and etching processes capability to from the opening 206 in operation 102. Also, the width $W_1$ of the first electrode 210 is decided in the operation 102. In a view of the lithography patterning and etching processes, reducing a size of the dimension of an opening (or etched portion) in a material layer is simpler than reducing the dimension of a feature (or remained portion) in a material layer. In this disclosure, the width $W_1$ of the first electrode 210 is decided in the opening 206. This disclosure provides an effective technique to facilitate scaling down of the resistance variable memory structure (250A or 250B), and also reduction of the operation current.

One aspect of the disclosure describes a semiconductor structure including a resistance variable memory structure. The semiconductor structure includes a dielectric layer. At least a portion of the resistance variable memory structure is over the dielectric layer. The resistance variable memory structure includes a first electrode embedded in the dielectric layer. A resistance variable layer disposed over the first electrode and a portion of the dielectric layer. A second electrode disposed over the resistance variable layer.

A further aspect of the disclosure describes a semiconductor structure including a resistance variable memory structure. The semiconductor structure includes a conductive structure. A barrier layer disposed over the conductive structure. The resistance variable memory structure is over the barrier layer. The resistance variable memory structure includes a first electrode disposed over the barrier layer. The barrier layer and the first electrode have a substantially same width $W_1$. A resistance variable layer disposed over the first electrode. A second electrode disposed over the resistance variable layer. The resistance variable layer and the second electrode have a substantially same width $W_2$ different from the width $W_1$.

The present disclosure also describes an aspect of a method of forming a resistance variable memory structure. The method includes forming an opening in a dielectric layer. The dielectric layer has a top surface. The opening is filled with a first electrode material substantially to the top surface. A resistance variable layer is deposited over the first electrode material. A second electrode material is deposited over the resistance variable layer. The resistance variable layer and the second electrode material are etched to form a resistance variable memory structure.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A semiconductor structure comprising:
a dielectric layer; and
a resistance variable memory structure, wherein a portion of the resistance variable memory structure is over the dielectric layer, the resistance variable memory structure comprising:
a conductive structure beneath the dielectric layer;
a barrier layer within an opening in the dielectric layer, the barrier layer being over and in direct contact with the conductive structure, the barrier layer extending to a lowermost surface of the dielectric layer;
a first electrode within the opening in the dielectric layer, the first electrode being over and in direct contact with an entire upper surface of the barrier layer;
a resistance variable layer over and in direct contact with the first electrode and a portion of the dielectric layer, the resistance variable layer comprising a conductive portion having a plurality of conductive filaments that provide a conductive path within the resistance variable layer;
a cap layer over and directly contacting the resistance variable layer, the cap layer being a conductive metal layer, the cap layer being a non-oxide layer, the cap layer being an unstable layer that is configured to deprive oxygen from the resistance variable layer to create oxygen vacancies in the resistance variable layer; and
a second electrode over the cap layer, the cap layer being a different metal than the second electrode, wherein the resistance variable layer, the cap layer, and the second electrode having a same width.

2. The semiconductor structure of claim 1, wherein the cap layer comprises titanium, tantalum or hafnium.

3. The semiconductor structure of claim 1, wherein the barrier layer comprises TiN, Ti, Ta, TaN, W or WN.

4. The semiconductor structure of claim 1, wherein the resistance variable layer comprises a high-k dielectric material, a binary metal oxide or a transition metal oxide.

5. The semiconductor structure of claim 1, wherein the resistance variable layer comprises nickel oxide, titanium oxide, hafnium oxide, zirconium oxide, zinc oxide, tungsten oxide, aluminum oxide, tantalum oxide, molybdenum oxide or copper oxide.

6. The semiconductor structure of claim 1, wherein each of the first electrode and the second electrode comprises Pt, AlCu, TiN, Au, Ti, Ta, TaN, TaN, W, WN or Cu.

7. The semiconductor structure of claim 1, wherein the first electrode is a work function metal.

8. The semiconductor structure of claim 1, wherein the first electrode and the barrier layer comprise different materials.

9. The semiconductor structure of claim 1, wherein a sidewall of the first electrode is free from the barrier layer.

10. A semiconductor structure comprising:
a conductive structure;
a barrier layer directly over the conductive structure;
a resistance variable memory structure over the barrier layer, the resistance variable memory structure comprising:
a first electrode directly over the barrier layer, the barrier layer and the first electrode having a substantially equal width $W_1$;
a resistance variable layer over the first electrode, the resistance variable layer comprising a conductive portion having a plurality of conductive filaments that provide a conductive path within the resistance variable layer;
a second electrode over the resistance variable layer; and
a conductive cap layer interposed between the second electrode and the resistance variable layer, the conductive cap layer, the resistance variable layer and the second electrode having a substantially equal width $W_2$ different from the width $W_1$, the conductive cap layer configured to form oxygen vacancies in the resistance variable layer; and
a dielectric layer over the conductive structure and surrounding both the barrier layer and the first electrode, the dielectric layer being in direct contact with sidewalls of the first electrode and sidewalls of the barrier layer, the barrier layer extending to a lowermost surface of the dielectric layer.

11. The semiconductor structure of claim 10, wherein the barrier layer is in direct contact with the conductive structure.

12. The semiconductor structure of claim 10, wherein the resistance variable layer comprises a high-K dielectric material, a binary metal oxide or a transition metal oxide.

13. The semiconductor structure of claim 10, wherein each of the first electrode and the second electrode comprises Pt, AlCu, TiN, Au, Ti, Ta, TaN, TaN, W, WN or Cu.

14. The semiconductor structure of claim 10, wherein barrier layer comprises TiN, Ti, Ta, TaN, W or WN.

15. The semiconductor structure of claim 10, wherein the conductive cap layer comprises titanium, tantalum or hafnium.

16. A manufacture, comprising:
a conductive structure;
a dielectric layer over the conductive structure, the dielectric layer having an opening defined therein;
a barrier layer in the opening of the dielectric layer, the barrier layer being over the conductive structure, the barrier layer extending to a lowermost surface of the dielectric layer;
a first electrode in the opening of the dielectric layer, the first electrode completely covering an upper surface of and in direct contact with the barrier layer;
a resistance variable layer over the dielectric layer and over the first electrode, the resistance variable layer comprising a conductive portion having a plurality of conductive filaments that provide a conductive path within the resistance variable layer;

a cap layer over the resistance variable layer, the cap layer being a conductive layer, the cap layer being configured to deprive the resistance variable layer of oxygen to form vacancy defects in the resistance variable layer, wherein the cap layer is titanium, tantalum, or hafnium, wherein the cap layer is in direct contact with the resistance variable layer; and a second electrode over the cap layer such that the cap layer is interposed between the second electrode and the resistance variable layer, the first electrode and the second electrode sandwiching the resistance variable layer, the first electrode and the second electrode being different metals, wherein a sidewall of the first electrode is in direct contact with the dielectric layer, and wherein the cap layer and the second electrode are different metals.

17. The manufacture of claim 16, wherein the resistance variable layer comprises a high-k dielectric material, a binary metal oxide or a transition metal oxide.

18. The manufacture of claim 16, wherein the resistance variable layer comprises nickel oxide, titanium oxide, hafnium oxide, zirconium oxide, zinc oxide, tungsten oxide, aluminum oxide, tantalum oxide, molybdenum oxide or copper oxide.

19. The manufacture of claim 16, wherein the first electrode and the second electrode comprise Pt, AlCu, TiN, Au, Ti, Ta, TaN, TaN, W, WN or Cu.

20. The manufacture of claim 16, wherein the resistance variable layer, the cap layer, and the second electrode have substantially a same width.

* * * * *